(12) United States Patent
Drechsel et al.

(10) Patent No.: US 11,616,164 B2
(45) Date of Patent: Mar. 28, 2023

(54) METHOD FOR PRODUCING A NITRIDE COMPOUND SEMICONDUCTOR COMPONENT

(71) Applicant: OSRAM OLED GmbH, Regensburg (DE)

(72) Inventors: Philipp Drechsel, Regensburg (DE); Werner Bergbauer, Windberg (DE); Thomas Lehnhardt, Regensburg (DE); Jürgen Off, Regensburg (DE); Joachim Hertkorn, Woerth An der Donau (DE)

(73) Assignee: OSRAM OLED GMBH, Regensburg (DE)

( * ) Notice: Subject to any disclaimer, the term of this patent is extended or adjusted under 35 U.S.C. 154(b) by 295 days.

(21) Appl. No.: 16/955,560

(22) PCT Filed: Jan. 17, 2019

(86) PCT No.: PCT/EP2019/051154
§ 371 (c)(1),
(2) Date: Jun. 18, 2020

(87) PCT Pub. No.: WO2019/145216
PCT Pub. Date: Aug. 1, 2019

(65) Prior Publication Data
US 2020/0335658 A1  Oct. 22, 2020

(30) Foreign Application Priority Data
Jan. 24, 2018  (DE) .................. 10 2018 101 558.5

(51) Int. Cl.
*H01L 33/00* (2010.01)
*H01L 33/12* (2010.01)

(52) U.S. Cl.
CPC ...... *H01L 33/0075* (2013.01); *H01L 33/0095* (2013.01); *H01L 33/12* (2013.01)

(58) Field of Classification Search
CPC ..................................................... H01L 33/007
(Continued)

(56) References Cited

U.S. PATENT DOCUMENTS

| 8,828,768 B2 | 9/2014 | Stauβ et al. |
| 9,184,051 B2 | 11/2015 | Stauss et al. |

(Continued)

FOREIGN PATENT DOCUMENTS

| CN | 104576847 A | 4/2015 |
| DE | 102006008929 A1 | 8/2007 |

(Continued)

OTHER PUBLICATIONS

Nobuhiko Sawaki, "Selective MOVPE of III-Nitrites and Device Fabrication on an Si Substrate," Photonics and Optoelectronics Meetings (POEM) 2008: Optoelectronic Devices and Integration, Proc. of SPIE, vol. 7279, 2009, 12 pages.

*Primary Examiner* — Hsin Yi Hsieh
(74) *Attorney, Agent, or Firm* — Slater Matsil, LLP

(57) ABSTRACT

A method for producing a nitride compound semiconductor component is disclosed. In an embodiment the method includes providing a growth substrate, growing a nucleation layer of an aluminum-containing nitride compound semiconductor onto the growth substrate, growing a tension layer structure for generating a compressive stress, wherein the tension layer structure comprises at least a first GaN semiconductor layer and a second GaN semiconductor layer, and wherein an Al(Ga)N interlayer for generating the compressive stress is disposed between the first GaN semiconductor layer and the second GaN semiconductor layer and growing a functional semiconductor layer sequence of the nitride compound semiconductor component onto the tension layer structure, wherein a growth of the second GaN semiconductor layer is preceded by a growth of a first 3D AlGaN (Continued)

layer on the Al(Ga)N interlayer in such a way that it has nonplanar structures.

20 Claims, 2 Drawing Sheets

(58) Field of Classification Search
USPC .......................................................... 438/478
See application file for complete search history.

(56) References Cited

U.S. PATENT DOCUMENTS

| | | |
|---|---|---|
| 10,147,601 B2 | 12/2018 | Drechsel et al. |
| 10,354,865 B2 | 7/2019 | Hertkorn et al. |
| 2001/0008205 A1 | 7/2001 | Wilke et al. |
| 2012/0074385 A1 | 3/2012 | Tak et al. |
| 2013/0240896 A1* | 9/2013 | Ozaki ............... H01L 29/66462 |
| | | 438/285 |
| 2013/0270575 A1 | 10/2013 | Humphreys et al. |
| 2014/0158976 A1 | 6/2014 | Dasgupta et al. |
| 2015/0031150 A1* | 1/2015 | Hertkorn ................ H01L 33/22 |
| | | 438/22 |
| 2015/0280058 A1 | 10/2015 | Kappers et al. |

FOREIGN PATENT DOCUMENTS

| | | |
|---|---|---|
| DE | 102011114665 A1 | 4/2013 |
| DE | 102014105303 A1 | 10/2015 |
| DE | 102015107661 A1 | 11/2016 |
| WO | 2011039181 A1 | 4/2011 |

* cited by examiner

METHOD FOR PRODUCING A NITRIDE COMPOUND SEMICONDUCTOR COMPONENT

This patent application is a national phase filing under section 371 of PCT/EP2019/051154, filed Jan. 17, 2019, which claims the priority of German patent application 102018101558.5, filed Jan. 24, 2018, each of which is incorporated herein by reference in its entirety.

TECHNICAL FIELD

The invention relates to a method of producing a nitride compound semiconductor component.

BACKGROUND

Nitride compound semiconductors are frequently used in LEDs or laser diodes that generally emit in the blue spectral region. Depending on the composition of the semiconductor material, for example, emission in the ultraviolet or green spectral region is also possible. By luminescence conversion by means of luminophores, it is possible to convert the shortwave radiation to longer wavelengths. In this way, it is possible to generate mixed-color light, especially white light. LEDs based on nitride compound semiconductors are therefore of considerable importance for LED lighting systems. Nitride compound semiconductors can also be used in electronic semiconductor components outside optoelectronics, for example, in a high electron mobility transistor (HEMT).

In the production of semiconductor components, the nitride compound semiconductor layers are generally grown epitaxially onto a growth substrate matched to the lattice constant and crystal structure of the nitride compound semiconductor material. Suitable substrate materials are especially sapphire, GaN or SiC. However, these substrate materials are comparatively costly.

The growth of nitride compound semiconductors onto comparatively costly silicon substrates is made more difficult by a comparatively large differential in the coefficients of thermal expansion of silicon and of the nitride compound semiconductor material. More particularly, in the course of cooling of the layer system from the growth temperature of more than 1000° C. used for growth of nitride compound semiconductors to room temperature, large tensile stresses are generated in the GaN.

German Patent Application No. DE 10 2006 008 929 A1 and International Patent Application No. WO 2011/039181 A1 each describe methods of producing nitride compound semiconductor components on silicon substrates. These publications disclose incorporation of a layer structure for generating a compressive stress between the silicon surface of the growth substrate and the functional layer sequence of the optoelectronic component, which counteracts the tensile stress generated by the silicon in the course of cooling.

German Patent Application No. DE 10 2011 114 665 A1 describes a process for producing a nitride compound semiconductor component, in which a tension layer structure for generating a compressive stress and a functional semiconductor layer sequence are grown on. The tension layer structure comprises a first GaN semiconductor layer and a second GaN semiconductor layer, wherein a masking layer is embedded in the first GaN semiconductor layer, and wherein an Al(Ga)N interlayer for generating a compressive stress is disposed between the first GaN semiconductor layer and the second GaN semiconductor layer.

One problem addressed is that of specifying a further-improved method of producing a nitride compound semiconductor component that can achieve a compressive stress and a low defect density coupled with low production complexity.

SUMMARY OF THE INVENTION

Embodiments provide a method of producing a nitride compound semiconductor component.

In at least one embodiment of the method, a growth substrate is first provided. The growth substrate may especially be a silicon substrate or an SOI (silicon on insulator) substrate. The method is advantageously also applicable to other substrate materials that especially have similar thermal expansion characteristics to silicon.

In at least one embodiment, in the method, a nucleation layer including an aluminum-containing nitride compound semiconductor is grown onto the growth substrate. The nucleation layer may especially contain or consist of AlN. But it is not ruled out that the nucleation layer also includes further constituents, for example, a dopant and/or small amounts of further group III materials, for example In or Ga.

The nucleation layer may be grown on in multiple component layers that differ in their composition and/or their growth parameters, for example, the growth temperature or the growth rate.

In a subsequent method step, a tension layer structure for generating a compressive stress is grown on top of the nucleation layer. The tension layer structure especially has a first GaN semiconductor layer and a second GaN semiconductor layer. The second GaN semiconductor layer follows the first GaN semiconductor layer in growth direction of the tension layer structure. What is meant here and hereinafter by a GaN semiconductor layer is a semiconductor layer comprising essentially GaN. This does not mean that the GaN semiconductor layer does not contain small amounts of a further group III material, especially In or Al, and/or a dopant.

There is advantageously an Al(Ga)N interlayer disposed between the first GaN semiconductor layer and the second GaN semiconductor layer. The interlayer preferably contains a very high proportion of Al or consists of AlN. But it is not ruled out that the interlayer contains small amounts of gallium and/or a dopant. By virtue of the Al-containing nitride semiconductor material of the interlayer having a smaller lattice constant than GaN, a compressive stress is generated in the subsequent second GaN semiconductor layer. There is advantageously already a compressive stress in the first GaN semiconductor layer as a result of the growth on the aluminum-containing nucleation layer, especially an AlN nucleation layer. However, such a compressive stress can be reduced again during the growth of the first GaN semiconductor layer, for example, via the development of dislocations. What is achieved by the insertion of the Al(Ga)N interlayer between the first GaN semiconductor layer and the second GaN semiconductor layer is that a sufficiently large compressive stress is built up in the second GaN semiconductor layer as well, which counteracts any tensile stress generated by the substrate in the course of cooling of the layer system from the growth temperature to room temperature.

In a further method step, the functional semiconductor layer sequence of the nitride compound semiconductor component is grown onto the tension layer structure. The functional semiconductor layer sequence may be the semiconductor layer sequence of an electronic or optoelectronic component. The functional semiconductor layer sequence may, in the case of an optoelectronic component, especially contain an active layer of the optoelectronic component. The active layer may, for example, be a radiation-emitting or radiation-receiving layer. In addition to the active layer, the functional semiconductor layer sequence may have, for example, an n-type semiconductor region and a p-type semiconductor region which surround the active layer.

The functional semiconductor layer sequence of the semiconductor component is especially based on a nitride compound semiconductor. What is meant by "based on a nitride compound semiconductor" in the present context is that the semiconductor layer sequence or at least one layer thereof comprises a III nitride compound semiconductor material, preferably $In_xAl_yGa_{1-x-y}N$ where $0 \leq x \leq 1$, $0 \leq y \leq 1$ and $x+y \leq 1$. This material need not necessarily have a mathematically exact composition as per the above formula. Instead, it may include one or more dopants and additional constituents that essentially do not alter the characteristic physical properties of the $In_xAl_yGa_{1-x-y}N$ material. For the sake of simplicity, however, the above formula includes only the essential constituents of the crystal lattice (In, Al, Ga, N), although these may be replaced in part by small amounts of further substances.

In at least one embodiment of the method, a 3D AlGaN layer is grown on top of the Al(Ga)N interlayer before the second GaN semiconductor layer is grown on. What is meant here and hereinafter by a "3D AlGaN layer" is a layer that consists wholly or essentially of AlGaN and is characterized by three-dimensional growth. The 3D AlGaN layer is especially grown on in such a way that it includes nonplanar structures. In the course of growth of the 3D AlGaN layer, the growth conditions, especially the growth temperature, the pressure and/or the gas flow rates, are adjusted in such a way as to effect predominantly three-dimensional growth.

Predominantly three-dimensional growth means more particularly that the surface of the 3D AlGaN layer is formed essentially by crystal faces that do not run parallel to the growth substrate. More particularly, the crystal faces of the 3D AlGaN layer are predominantly not oriented in the c plane. The c plane corresponds more particularly to a [0001] crystal surface of the AlGaN material. The growth of the 3D AlGaN layer in the [0001] crystal direction is preferably negligibly small. Owing to the growth conditions, the 3D AlGaN layer forms nonplanar three-dimensional structures, especially pyramidal structures.

It has been found that the arrangement of the 3D AlGaN layer atop the Al(Ga)N interlayer which serves to build up a compressive stress can reduce the dislocation density. It has been found that the Al(Ga)N interlayer advantageously brings about compressive stress in the second GaN layer grown on subsequently, but that, on the other hand, new dislocations also proceed from the Al(Ga)N interlayer. The method described herein makes particular use of the idea that the arrangement of the 3D AlGaN layer atop the Al(Ga)N interlayer can reduce these dislocations without too greatly impairing the compressive stress.

In at least one embodiment, the 3D AlGaN layer is produced by means of metal-organic vapor phase epitaxy (MOVPE). It is especially possible to produce the entire tension layer structure and the functional semiconductor layer sequence of the nitride compound semiconductor component by means of metal-organic vapor phase epitaxy. The nonplanar structures of the 3D AlGaN layer can especially be generated by reducing the growth temperature in the growing of the 3D AlGaN layer by comparison with the further semiconductor layers. Two-dimensional nitride compound semiconductor layers are produced, for example, at a growth temperature of 1050° C. or more. The 3D AlGaN layer is preferably produced at a growth temperature of less than 1050° C. Preferably, the growth temperature in the growth of the 3D AlGaN layer is less than 1000° C.

In at least one embodiment of the method, the 3D AlGaN layer, the first GaN semiconductor layer and the second GaN semiconductor layer are produced by means of metal-organic vapor phase epitaxy, using $NH_3$ as reaction gas. Preferably, an $NH_3$ gas flow rate in the production of the 3D AlGaN layer is at least 50% smaller than in the production of the first GaN semiconductor layer and/or the second GaN semiconductor layer.

In at least one embodiment of the method, the 3D AlGaN layer, the first GaN semiconductor layer and the second GaN semiconductor layer are produced by means of metal-organic vapor phase epitaxy in a reaction chamber, wherein the pressure in the reaction chamber in the production of the 3D AlGaN layer is smaller than in the production of the first GaN semiconductor layer and/or the second GaN semiconductor layer.

The three-dimensional growth of the 3D AlGaN layer, in one configuration, may be promoted by the different lattice constant from the underlying semiconductor layer. The difference in the lattice constants promotes what is called Stranski-Krastanov growth, meaning that a three-dimensional layer is obtained. Three-dimensional growth may also be promoted by at least one of the following growth parameters: high temperature, high Si doping, low $NH_3$ flow rate, high $H_2/N_2$ factor in the reactor.

In at least one embodiment of the method, the tension layer structure does not have a masking layer. More particularly, by comparison with the prior art from publication DE 10 2011 114 665 A1 mentioned in the introduction, it is possible to dispense with the silicon nitride masking layer and the GaN semiconductor layer disposed directly thereon. The production complexity for application and structuring of the masking layer can therefore advantageously be dispensed with. Instead, the dislocation density is reduced in the method by means of the 3D AlGaN layer. The 3D AlGaN layer thus has the particular advantage that no masking layer has to be incorporated into the tension layer structure for reduction of the dislocation density.

In at least one embodiment of the method, the tension layer structure does not include any silicon nitride. More particularly, it is possible to dispense with a silicon nitride masking layer. It is additionally advantageous that, by comparison with the prior art cited, it is possible to dispense with the GaN semiconductor layer disposed between the masking layer and the Al(Ga)N interlayer. It has been found that the GaN semiconductor layer can have a disadvantageous tensile stress on the masking layer.

In at least one embodiment of the method, the growth of the nucleation layer is followed and the growth of the first GaN layer is preceded by growth of a second 3D AlGaN layer in such a way that it has nonplanar structures. The second 3D AlGaN layer can be produced analogously to the above-described 3D AlGaN layer which is grown on the Al(Ga)N interlayer. The second 3D AlGaN layer has the particular advantage that the dislocation density is reduced even directly above the nucleation layer. This has the particular advantage that even the first GaN semiconductor layer has a reduced dislocation density. In addition, even the first GaN semiconductor layer may be compressively stressed and hence contribute to the overall compressive stress in the tension layer structure.

In at least one embodiment of the method, the nucleation layer is produced by sputtering. Sputtering advantageously enables deposition of the nucleation layer on the growth substrate in a relaxed manner. It has been found that the nucleation layer has column-shaped growth in the case of production by sputtering. This can be detected, for example, with the aid of atomic force microscopy or transmission electron microscopy. In the case of the column-shaped growth of the nucleation layer produced by means of sputtering, grain boundaries that contribute to defect reduction are advantageously formed.

In at least one embodiment of the method, the total thickness of the tension layer structure is less than 5 μm. A low total thickness of the tension layer structure of preferably less than 5 μm is especially achieved by dispensing with a masking layer and a GaN semiconductor layer disposed between the masking layer and the Al(Ga)N interlayer. The complexity of production is thus advantageously reduced.

In at least one embodiment of the method, the growth substrate has a silicon surface. The growth substrate may especially be a silicon substrate. The growth substrate may alternatively also be an SOI (silicon on insulator) substrate.

In at least one embodiment of the method, the silicon surface of the growth substrate is a (111) plane. The (111) plane of a silicon crystal has particularly good suitability for growth of a hexagonal nitride compound semiconductor material owing to the hexagonal crystal structure.

In at least one embodiment of the method, the nitride compound semiconductor component is an optoelectronic component. The nitride compound semiconductor component may especially be a radiation-emitting optoelectronic component, for example an LED.

In at least one embodiment of the method, the functional semiconductor layer sequence is a light-emitting diode layer sequence comprising an n-type semiconductor region, a p-type semiconductor region, and an active layer disposed between the n-type semiconductor region and the p-type semiconductor region.

In a preferred configuration of the method, the growth substrate is detached after the growth of the functional semiconductor layer sequence. In this configuration, the functional semiconductor layer sequence is advantageously bonded to a carrier substrate on an opposite surface from the growth substrate. Since the carrier substrate need not be suitable for growth of a nitride compound semiconductor material, it may advantageously be selected using other criteria, especially a good thermal and/or electrical conductivity. In addition, in this configuration, the bonding of the functional semiconductor layer sequence to the carrier substrate may be preceded by application of a mirror layer to the functional semiconductor layer sequence, in order to reflect the radiation emitted in the direction of the carrier substrate in the operation of the nitride compound semiconductor component toward a radiation exit surface opposite the carrier substrate.

After the detachment of the growth substrate, the nucleation layer and the tension layer structure may be at least partly removed, for example, by an etching method. In this case, any residue of the tension layer structure that remains in the optoelectronic component is disposed on the radiation exit side of the optoelectronic component.

BRIEF DESCRIPTION OF THE DRAWINGS

The invention is elucidated in detail hereinafter by working examples in association with FIGS. 1 to 4.

DETAILED DESCRIPTION OF ILLUSTRATIVE EMBODIMENTS

Figure 1:
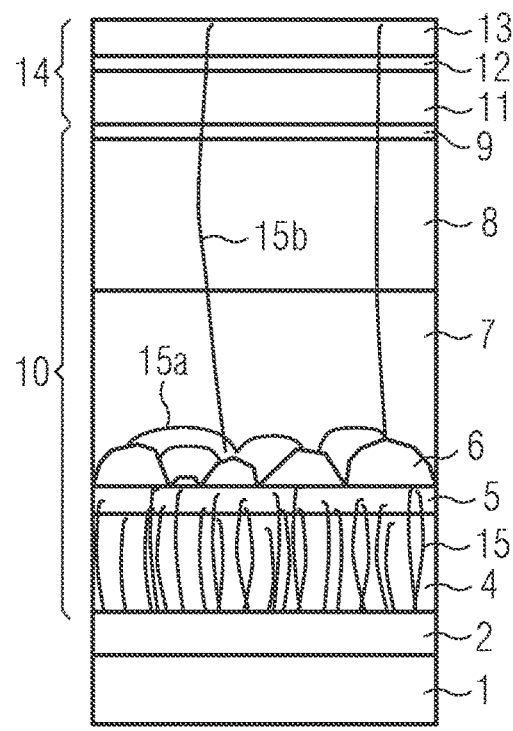
FIG. 1 shows a schematic diagram of a cross section through the semiconductor layer sequence in a working example of the method of producing a nitride compound semiconductor component.

Constituents that are the same or have the same effect are each given the same reference numerals in the figures. The constituents shown and the size ratios of the constituents relative to one another should not be considered to be true to scale.

In the method, as shown in FIG. 1, a semiconductor layer sequence of the nitride compound semiconductor component is produced on a growth substrate 1. The growth substrate 1 preferably has a silicon surface. The growth substrate 1 may, for example, be a silicon wafer. Alternatively, however, it is also possible that the growth substrate 1 is an SOI substrate. The silicon surface of the growth substrate 1 is preferably a (111) crystal plane which, owing to its hexagonal symmetry, has particularly good suitability for growth of nitride compound semiconductors. The growth substrate 1 with the silicon surface has the advantage of being comparatively inexpensive by comparison with substrates of sapphire, GaN or SiC that are generally used for growth of nitride compound semiconductor materials.

In the method, a nucleation layer 2 of an aluminum-containing nitride compound semiconductor material is first grown onto the surface of the growth substrate 1. The nucleation layer 2 preferably contains or consists of AlN. The nucleation layer 2 preferably has a thickness between 100 nm and 300 nm, for example about 200 nm. The nucleation layer 2 may be grown on in multiple component layers (not shown) that differ in their composition and/or their growth parameters, for example, the growth temperature or the growth rate.

In a further step of the method, a first GaN semiconductor layer 4 is grown onto the nucleation layer 2. The first GaN semiconductor layer 4 may have a multitude of dislocations 15 owing to the lattice mismatch with the growth substrate 1.

Subsequently, an interlayer 5 of AlN or AlGaN is grown on. The Al(Ga)N interlayer 5, owing to its aluminum content, has a smaller lattice constant than GaN. The Al(Ga)N interlayer 5 is therefore suitable for generating a compressive stress in a second GaN semiconductor layer grown on subsequently. The higher the aluminum content in the Al(Ga)N interlayer 5, the greater this effect. Preferably, the interlayer 5 is therefore free of gallium and advantageously consists of AlN.

Subsequently, a 3D AlGaN layer 6 is grown onto the Al(Ga)N interlayer 5. The 3D AlGaN layer 6 features three-dimensional growth; more particularly, the 3D AlGaN layer 6 is grown on in such a way that it has nonplanar structures.

The essentially three-dimensional growth of the 3D AlGaN layer 6 is especially enabled by a suitable choice of the growth conditions. Preferably, the 3D AlGaN layer 6, like the entire tension layer structure 10, is produced by means of metal-organic vapor phase epitaxy (MOVPE). For achievement of three-dimensional growth, in the deposition of the 3D AlGaN layer 6, it is possible, for example, to reduce the growth temperature. Conventional planar nitride compound semiconductor layers can be produced, for example, at a growth temperature of more than 1050° C. The 3D AlGaN layer 6 is preferably produced at a growth temperature lower than 1050° C., for example, at a growth temperature of 1000° C. or less. An alternative and/or additional option for achievement of three-dimensional growth is to vary, especially to reduce, the pressure in the reaction chamber in the course of production of the 3D AlGaN layer 6 by comparison with the pressure in the production of the other semiconductor layers. Yet a further option is to alter the ratio of the group III components to the group V components in the metal-organic vapor phase epitaxy. For example, it is possible to reduce the gas flow rate of $NH_3$ that serves to provide the nitrogen component (group V element).

In a further step, a second GaN semiconductor layer 7 is deposited onto the 3D AlGaN layer 6. In the deposition of the second GaN semiconductor layer 7, the growth conditions are again set in such a way that there is two-dimensional layer growth. On coalescence of the GaN semiconductor material of the second GaN semiconductor layer 7, at least a portion 15a of the dislocations bends back in lateral direction, such that this portion 15a of the dislocations does not spread out further in vertical direction in the semiconductor layer sequence. More particularly, only a small portion 15b of the dislocations propagates further in vertical direction. The 3D AlGaN layer 6 disposed atop the Al(Ga)N interlayer 5 thus leads advantageously to a reduction in the dislocation density in the tension layer structure 10 and especially in the functional semiconductor layer sequence 14 grown on subsequently in an electronic or optoelectronic component.

The second GaN semiconductor layer 7 is preferably an undoped layer. After the growth of the second GaN semiconductor layer 7, in the working example, a third GaN semiconductor layer 8 is grown on, which is preferably a doped semiconductor layer, especially an n-doped semiconductor layer. The third GaN semiconductor layer 8 may especially be a silicon-doped semiconductor layer. It is possible that the tension layer structure 10 also contains one or more further layers, for example, an interlayer 9 which is grown on prior to the growth of the functional semiconductor layer sequence 14 of an electronic or optoelectronic component. The interlayer 9 may, for example, be an AlGaN semiconductor layer.

The tension layer structure 10 advantageously has compressive stress which, in the course of cooling of the layer sequence from the growth temperature of more than 1000° C. to room temperature, counteracts any tensile stress generated by the growth substrate 1.

The compressive stress in the tension layer structure 10 is achieved firstly in that the first GaN semiconductor layer 4 has been grown on the underlying nucleation layer 2 that has a lower lattice constant than GaN. The compressive stress built up in the first GaN semiconductor layer 4 in this way relaxes at least slightly with increasing layer thickness during growth owing to dislocations 15 in the semiconductor material. As a result of the Al(Ga)N interlayer 5 having a lower lattice constant than GaN that has been inserted between the first GaN semiconductor layer 4 and the second GaN semiconductor layer 7, this compressive stress is built up again.

What is particularly advantageous about the tension layer structure 10 is that not only is compressive stress built up, but a reduction in dislocation density is also achieved by means of the 3D AlGaN layer 6. Preferably, a dislocation density of less than $1 \times 10^9$ $cm^{-2}$ is achieved in the tension layer structure 10 and/or in the subsequent functional semiconductor layer sequence 14 of an electronic or optoelectronic component. The dislocation density is more preferably even less than $5 \times 10^8$ $cm^{-2}$.

In a next method step, the functional semiconductor layer sequence 14 of an electronic or optoelectronic component is grown onto the tension layer structure 10 grown on beforehand. The functional semiconductor layer sequence 14 of the electronic or optoelectronic component is based on a nitride compound semiconductor.

The functional semiconductor layer sequence 14 may especially contain an active layer 12 of an optoelectronic component. The active layer 12 may especially be a radiation-emitting or radiation-receiving layer. The active layer 12 comprises, for example, $In_xAl_yGa_{1-x-y}N$ with $0 \leq x \leq 1$, $0 \leq y \leq 1$ and $x+y \leq 1$. The active layer may take the form, for example, of a pn junction, of a double heterostructure, or of a simple quantum well structure or multiple quantum well structure. The term "quantum well structure" encompasses any structure in which charge carriers experience quantization of their energy states as a result of confinement. More particularly, the term "quantum well structure" does not include any statement as to the dimensionality of the quantization. It thus includes, inter alia, quantum troughs, quantum wires and quantum dots, and any combination of these structures.

In addition, the functional semiconductor layer sequence 14 contains, for example, a first semiconductor region 11 and a second semiconductor region 13, wherein the first semiconductor region 11 is n-doped, for example, and the second semiconductor region 13 is p-doped, for example. The first semiconductor region 11 and the second semiconductor region 13 may each be composed of multiple component layers.

Figure 2:
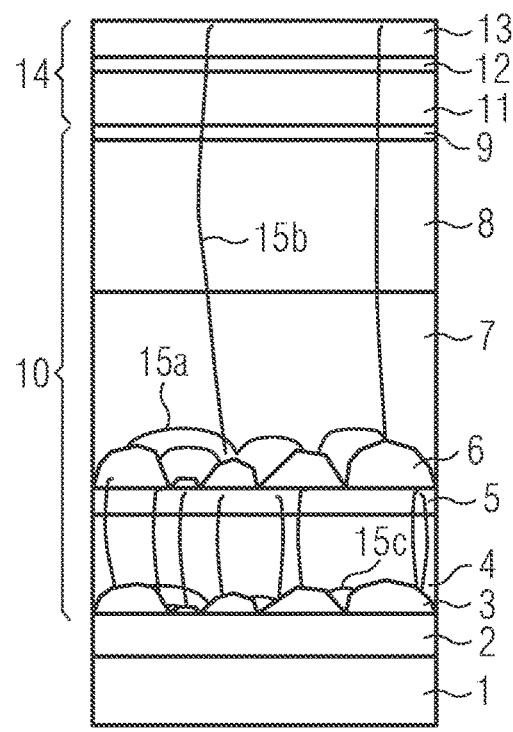
FIG. 2 shows a schematic diagram of a cross section through the semiconductor layer sequence in a second working example of the method of producing a nitride compound semiconductor component.

FIG. 2 shows a second working example of the semiconductor layer sequence in a method of producing a nitride compound semiconductor component. The second working example differs from the first working example in that a second 3D AlGaN layer 3 is disposed atop the nucleation layer 2. Prior to the growth of the first GaN semiconductor layer 4, the second 3D AlGaN layer 3 is grown on in such a way that it has nonplanar structures. As in the case of the 3D AlGaN layer 6 atop the Al(Ga)N interlayer 5, this is effected by a suitable setting of the growth conditions. The second 3D AlGaN layer is especially grown on in such a way that it has three-dimensional growth. Growth conditions suitable for the purpose correspond to those described before in association with the 3D AlGaN layer. More particularly, in the production of the second 3D AlGaN layer 3, it is possible to set a lower growth temperature and/or an altered, for example lower, pressure than in the production of the subsequent first GaN semiconductor layer 4.

The second 3D AlGaN layer 3 disposed between the nucleation layer 2 and the first GaN semiconductor layer 4 has the particular advantage that a portion of the dislocations 15c already bend back as the first GaN semiconductor layer 4 grows onto the nonplanar structures and do not propagate further in vertical direction in the tension layer structure 10. In this way, a further reduction in dislocation density is advantageously achieved.

Figure 3:
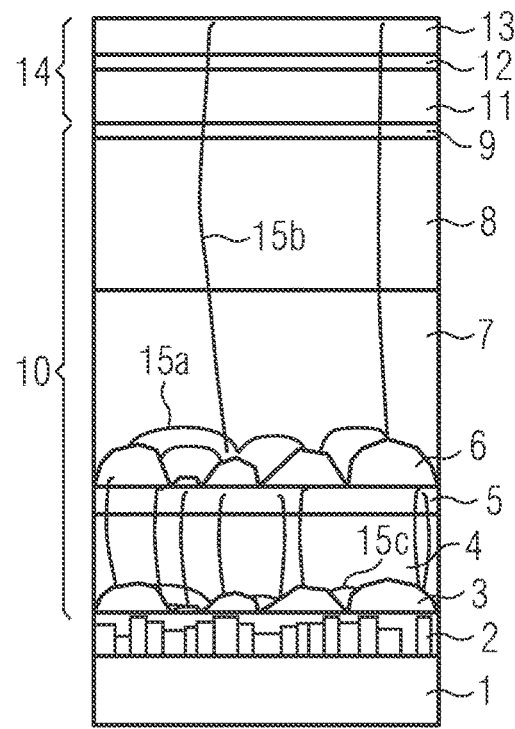
FIG. 3 shows a schematic diagram of a cross section through the semiconductor layer sequence in a third working example of the method of producing a nitride compound semiconductor component.

FIG. 3 shows a further working example of the semiconductor layer sequence in the method of producing a nitride compound semiconductor component. The working example of FIG. 3 differs from the working example of FIG. 2 in that the nucleation layer 2 has been produced by sputtering. The nucleation layer 2 is preferably an AlN layer produced by sputtering. In the production by sputtering, the nucleation layer may especially be deposited on the growth substrate 1 in a relaxed manner. It is possible here, for example, after the deposition, to detect column-shaped growth by means of atomic force microscopy or transmission electron microscopy. Grain boundaries are formed here, which lead to a further reduction in defects, especially after heating up to the growth temperature of the subsequent MOVPE process and overgrowth with the semiconductor material of the subsequent layer. In this way, it is advantageously possible to achieve an even lower defect density.

Figure 4:
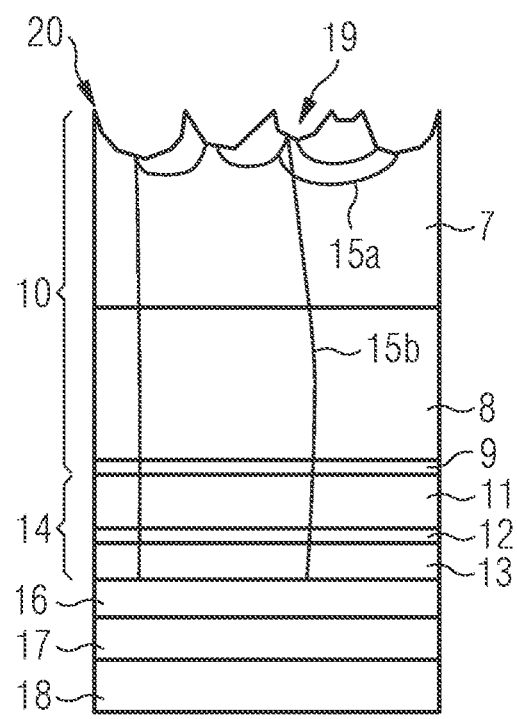
FIG. 4 shows schematic diagram of a cross section through the semiconductor layer sequence in a fourth working example of the method of producing a nitride compound semiconductor component.

In one configuration of the method, a nitride compound semiconductor component 20 is produced, in the form of what is called a thin-film component. In this configuration, as shown in FIG. 4, a mirror layer 16 is first applied on a side of the functional semiconductor layer sequence 14 remote from the tension layer structure. The mirror layer 16 may, for example, be a silver layer. Subsequently, the layer stack is bonded to a carrier substrate 18 on the side remote from the growth substrate, for example, with a bonding layer 17. The bonding layer 17 may, for example, be a solder layer. Further interlayers may be present between the mirror layer 16 and the solder layer 17, which are not shown here for simplification of the diagram. Such interlayers may, for example, be adhesion promoter layers, wetting layers or diffusion barrier layers.

The carrier substrate 18 need advantageously not be suitable for epitaxial growth of a nitride compound semiconductor material, and may therefore advantageously be selected using other criteria, for example, a high electrical and/or thermal conductivity. In a further method step, the growth substrate 1 is detached from the side of the layer stack remote from the carrier substrate 18. The side of the semiconductor layer sequence facing the original growth substrate may thus preferably serve as radiation exit surface in the finished optoelectronic component. After the detachment of the growth substrate, it is possible to remove further layers of the layer stack originally applied, such as more particularly the nucleation layer 2 and/or at least parts of the tension layer structure 10. This can be effected, for example, by an etching process. For example, in the optoelectronic component 20 shown in FIG. 4, the growth substrate 1, the nucleation layer 2, the second 3D AlGaN layers 3, the first GaN semiconductor layer 4, the Al(Ga)N interlayer 5 and the 3D AlGaN layer 6 have already been removed and are thus no longer present in the finished optoelectronic component. The second AlGaN layer 7 has advantageously been provided with an outcoupling structure 19 on the interface that now serves as radiation exit surface.

A particular feature of the nitride compound semiconductor component 20 produced by the method described herein is a particularly low dislocation density, which advantageously increases the efficiency of the component.

The invention is not limited by the description with reference to the working examples. Instead, the invention encompasses every new feature and every combination of features, which especially includes every combination of features in the patent claims, even if this feature or this combination itself is not explicitly specified in the patent claims or working examples.

The invention claimed is:

1. A method for producing a nitride compound semiconductor component, the method comprising:
    providing a growth substrate;
    growing a nucleation layer of an aluminum-containing nitride compound semiconductor onto the growth substrate;
    growing a tension layer structure for generating a compressive stress,
    wherein the tension layer structure comprises at least a first GaN semiconductor layer and a second GaN semiconductor layer, and
    wherein an Al(Ga)N interlayer for generating the compressive stress is disposed between the first GaN semiconductor layer and the second GaN semiconductor layer; and
    growing a functional semiconductor layer sequence of the nitride compound semiconductor component onto the tension layer structure,
    wherein a growth of the second GaN semiconductor layer is preceded by a growth of a first 3D AlGaN layer on the Al(Ga)N interlayer such that the first 3D AlGaN layer has nonplanar structures, and
    wherein the nonplanar structures form a nonplanar side of the first 3D AlGaN layer, the nonplanar side facing away from the growth substrate.

2. The method of claim 1, wherein the first 3D AlGaN layer is produced by metal-organic vapor phase epitaxy, and wherein a growth temperature in the growth of the first 3D AlGaN layer is less than 1000° C.

3. The method of claim 1,
    wherein the first GaN semiconductor layer and the second GaN semiconductor layer are produced by metal-organic vapor phase epitaxy,
    wherein NH3 is used as reaction gas, and
    wherein an NH3 gas flow rate while producing the first 3D AlGaN layer is lower than while producing the first GaN semiconductor layer and/or the second GaN semiconductor layer.

4. The method of claim 1,
    wherein the first 3D AlGaN layer, the first GaN semiconductor layer and the second GaN semiconductor layer are produced by metal-organic vapor phase epitaxy in a reaction chamber, and
    wherein a pressure in the reaction chamber while producing the first 3D AlGaN layer is lower than while producing the first GaN semiconductor layer and/or the second GaN semiconductor layer.

5. The method of claim 1, wherein the tension layer structure does not have a masking layer.

6. The method of claim 1, wherein the tension layer structure does not include silicon nitride.

7. The method of claim 1, wherein a growth of the nucleation layer is followed and a growth of the first GaN semiconductor layer is preceded by a growth of a second 3D AlGaN layer such that the second 3D AlGaN layer has nonplanar structures.

8. The method of claim 1, wherein the nucleation layer is produced by sputtering.

9. The method of claim 1, wherein a total thickness of the tension layer structure is less than 5 µm.

10. The method of claim 1, wherein the second GaN semiconductor layer is undoped, and wherein the second GaN semiconductor layer is followed by a third GaN semiconductor layer which is doped.

11. The method of claim 1, wherein the growth substrate has a silicon surface.

12. The method of claim 11, wherein the silicon surface is a plane.

13. The method of claim 1, wherein the nitride compound semiconductor component is an optoelectronic component.

14. The method of claim 13, wherein the functional semiconductor layer sequence is a light-emitting diode layer sequence comprising an n-type semiconductor region, a p-type semiconductor region, and an active layer disposed between the n-type semiconductor region and the p-type semiconductor region.

15. The method of claim 1, wherein the growth substrate is detached after a growth of the functional semiconductor layer sequence.

16. The method of claim 1, wherein the functional semiconductor layer sequence is bonded to a carrier substrate on an opposite side from the growth substrate.

17. The method of claim 1, wherein the second GaN semiconductor layer is grown directly on the nonplanar structures of the first 3D AlGaN layer.

18. The method of claim 1, wherein the first 3D AlGaN layer is directly disposed on the Al(Ga)N interlayer.

19. The method of claim 7, wherein the nonplanar structures of the second 3D AlGaN layer form a nonplanar side of the second 3D AlGaN layer, the nonplanar side of the second 3D AlGaN layer facing away from the growth substrate.

20. A method for producing a nitride compound semiconductor component, the method comprising:
   providing a growth substrate;
   growing a nucleation layer of an aluminum-containing nitride compound semiconductor onto the growth substrate;
   growing a tension layer structure for generating a compressive stress,
   wherein the tension layer structure comprises at least a first GaN semiconductor layer and a second GaN semiconductor layer, and
   wherein an Al(Ga)N interlayer for generating the compressive stress is disposed between the first GaN semiconductor layer and the second GaN semiconductor layer; and
   growing a functional semiconductor layer sequence of the nitride compound semiconductor component onto the tension layer structure,
   wherein a growth of the second GaN semiconductor layer is preceded by a growth of a first 3D AlGaN layer on the Al(Ga)N interlayer such that the first 3D AlGaN layer has nonplanar structures, and
   wherein the first 3D AlGaN layer has crystal faces that are predominantly not oriented in a c plane.

* * * * *